(12) United States Patent
Kondo et al.

(10) Patent No.: US 7,339,219 B2
(45) Date of Patent: Mar. 4, 2008

(54) CAPACITANCE DEVICE INCLUDING A PEROVSKITE FILM HAVING (001) ORIENTATION

(75) Inventors: Masao Kondo, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 309 days.

(21) Appl. No.: 11/063,731

(22) Filed: Feb. 24, 2005

(65) Prior Publication Data
US 2005/0213282 A1 Sep. 29, 2005

(51) Int. Cl.
*H01L 29/76* (2006.01)
(52) U.S. Cl. .................. 257/295; 361/311; 257/347; 257/288
(58) Field of Classification Search .................. 257/68; 361/311
See application file for complete search history.

(56) References Cited

U.S. PATENT DOCUMENTS

| | | | |
|---|---|---|---|
| 5,650,362 A | | 7/1997 | Nashimoto et al. |
| 5,985,404 A | * | 11/1999 | Yano et al. ............... 428/846.1 |
| 6,096,434 A | | 8/2000 | Yano et al. |
| 6,278,138 B1 | * | 8/2001 | Suzuki ....................... 257/103 |
| 2002/0155667 A1 | * | 10/2002 | Higuchi et al. ............. 438/295 |
| 2004/0084994 A1 | * | 5/2004 | Iwashita et al. ............ 310/311 |

FOREIGN PATENT DOCUMENTS

| | | |
|---|---|---|
| JP | 10-107216 | 4/1998 |
| JP | 10-120494 | 5/1998 |

* cited by examiner

*Primary Examiner*—Jerome Jackson
*Assistant Examiner*—Jami M Valentine
(74) *Attorney, Agent, or Firm*—Westerman, Hattori, Daniels & Adrian, LLP.

(57) ABSTRACT

A capacitance device including a substrate having a (111) orientation, an epitaxial film formed on the substrate and having a perovskite structure and a (001) orientation, and an electrode formed on the epitaxial film. The present invention may comprise devices having various functions, such as a ferroelectric random access memory, a SAW filter, or a ferroelectric actuator.

17 Claims, 15 Drawing Sheets

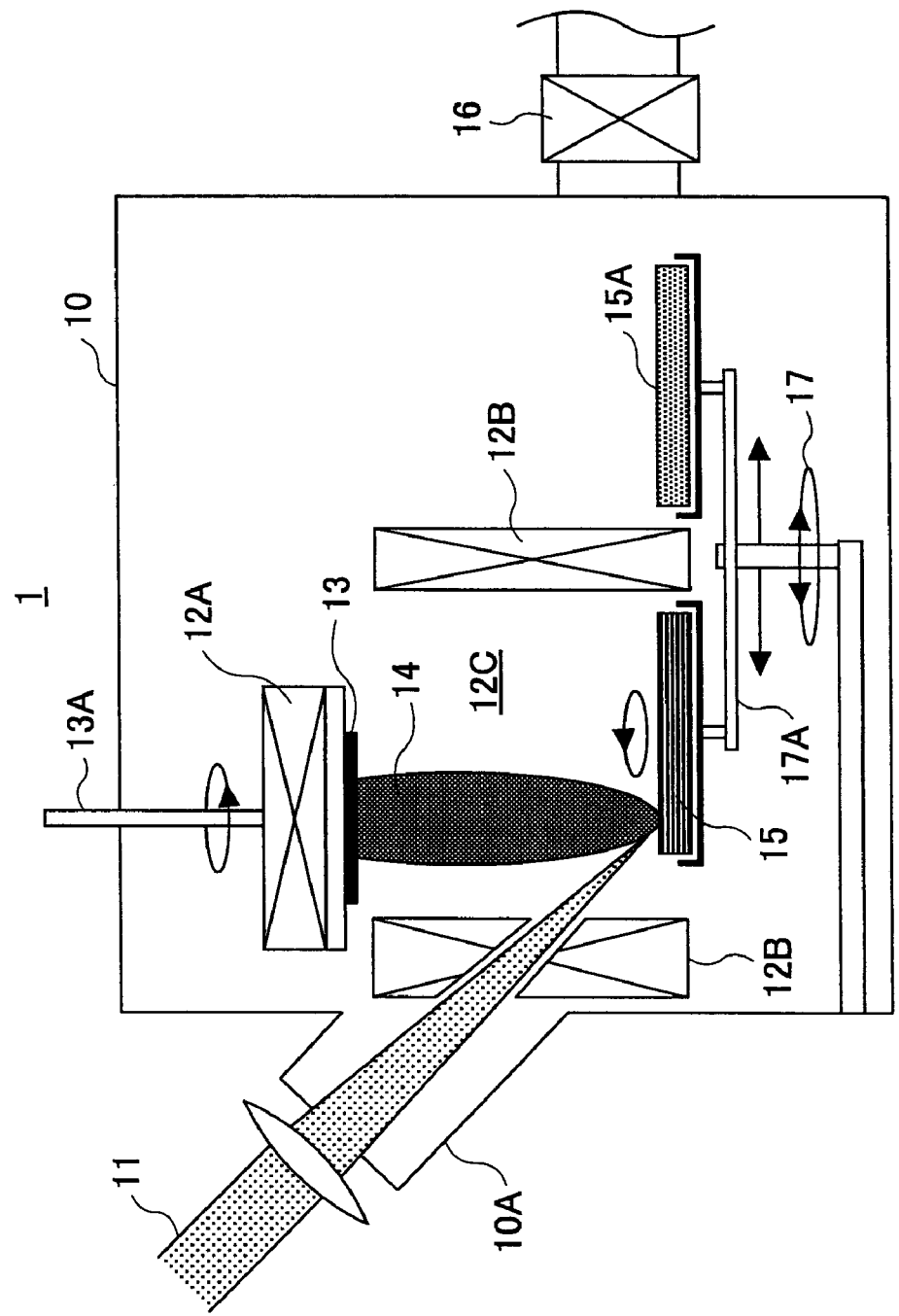

CAPACITANCE DEVICE INCLUDING A PEROVSKITE FILM HAVING (001) ORIENTATION

TECHNICAL FIELD

The present invention generally relates to a device having a ferroelectric film, and particularly, to a semiconductor device having a ferroelectric film being epitaxially grown on a silicon substrate.

In the related art, it is a frequently performed process to form an oxide film on a silicon substrate. In most cases, the oxide film is an amorphous film, and the oxide film is primarily used as an insulating film or a dielectric film.

On the other hand, in a semiconductor device utilizing properties of the ferroelectric film, such as a Ferroelectric Random Access Memory (FeRAM), a crystalline film is used in order to show such properties.

Several metal oxide crystals possess various properties such as ferroelectric properties, piezoelectric properties, pyroelectricity, superconductivity, and others, in addition to insulating properties, dielectric properties. If the metal oxide crystals of these properties can be made into a thin film on a silicon single crystal substrate, it is thought that it is possible to fabricate devices having various functions, such as memories, sensors, and filters. Most of the above mentioned properties are originated from the crystalline property of the metal oxides, as these properties disappear or become very weak in an amorphous state.

BACKGROUND OF THE INVENTION

In a ferroelectric film used in a FeRAM, the above properties can be obtained by heating the ferroelectric film to several hundreds degrees Celsius to crystallize the ferroelectric film, usually with oxygen being present. However, in the related art, the ferroelectric film is a poly-crystalline film, hence, even if the overall crystalline orientation of the ferroelectric film is aligned to be along a specified direction, for example, a direction perpendicular to a substrate, the orientation of the ferroelectric film is random in the other directions, and due to this, crystal grain boundary defects are inevitable. Related to this problem, in the related art, a semiconductor device having crystalline oxide films only shows properties of the oxide films.

On the other hand, in the related art, it is very difficult to form, on a silicon single crystal substrate, an oxide film having so-called epitaxial alignment, that is, the orientation of a crystal is aligned not only in a direction perpendicular to the substrate, but also in a direction parallel to the substrate.

In order to epitaxially grow a thin oxide film on a silicon single crystal substrate, it is necessary to utilize the orientation of the silicon single crystal substrate. However, the silicon single crystal substrate has the same chemical properties as metals, and the surface of the silicon single crystal substrate is apt to be oxidized when being exposed to an oxygen atmosphere at a high temperature, hence producing a silicon oxide film ($SiO_x$). Because the silicon oxide film is not a crystal, and does not have a specific orientation, an oxide film cannot be epitaxially grown on the silicon oxide film.

In order for epitaxial growth, it is also important to minimize reactions and diffusions between the thin film to be grown and the silicon single crystal substrate. For this reason, not all of oxides can be grown by epitaxial growth on the silicon single crystal substrate. So far, only the following materials were reported to be able to be epitaxially grown on the silicon single crystal substrate, specifically, oxides of rare earth elements, such as, yttrium stabilized zirconia (YSZ) (J. Appl. Phys. Vol. 67, (1989) pp. 2447), magnesia-spinel ($MgAl_2O_4$: ISSCC Digest of Tech. Papers (1981) pp. 210), cerium dioxide ($CeO_2$: Appl. Phys. Lett. Vol. 56 (1990) pp. 1332), and strontium titanate ($SrTiO_3$) (Jpan. J. Appl. Phys. 30 (1990) L1415).

An index indicating crystalline quality of the thin oxide film epitaxially grown on the silicon single crystal substrate is a FWHM value (Full Width at Half Maximum) of the peak obtained in X-ray diffraction. The FWHM is deduced from a rocking curve obtained by scanning a θ axis with a 2θ axis of the X-ray diffraction peak being fixed, and equals the width of the rocking curve at half peak strength of the rocking curve. The FWHM expresses the degree of the crystal tilt in the thin film, and a smaller FWHM indicates that a state closer to the single crystalline state, that is, having a higher degree of crystalline orientation. Because when crystalline orientations of the thin film are aligned in a higher degree, the electric properties of the thin film become better, for example, the hysteresis property, or the leakage property are improved, it is important to grow a thin film having a FWHM as small as possible when the thin film is used in a device.

Materials having a perovskite structure, a typical example of which is barium titanate ($BaTiO_3$), are ferroelectric materials, and are attractive because they possess piezoelectric properties, dielectric properties, pyroelectricity, semi-conductivity, electric superconductivity. But in the related art, it is difficult to directly epitaxially grow the material having a perovskite structure on the silicon single crystal substrate. This can be attributed to, for example, production of an amorphous silicon oxide film (SiOx) on the silicon single crystal substrate, or formation of a reaction phase of silicide or others.

So far, an epitaxial perovskite film can be grown on the silicon single crystal substrate only from strontium titanate ($SrTiO_3$). When epitaxially growing the perovskite film on the silicon single crystal substrate from strontium titanate ($SrTiO_3$), a metallic strontium film is used in between as an intermediate layer. Because titanium (Ti) is liable to react with silicon (Si), in order to prevent the reactions between titanium and silicon, after the metallic strontium film is formed on the silicon substrate surface, strontium (Sr) and titanium (Ti) are supplied while oxygen gas is being flowed, thereby forming a strontium titanate film. If the intermediate metallic Sr layer is thin, Ti diffuses into the metallic Sr layer in the growing strontium titanate film, as if a structure is obtained by directly and epitaxially growing the strontium titanate film on the silicon single crystal substrate.

As described above, in order to epitaxially grow the strontium titanate ($SrTiO_3$) film, it is essential to control the process at the level of atomic layer, and a technique called molecular beam epitaxy (MBE) is used for this purpose. As disclosed in Japanese Laid Open Patent Application No. 10-107216, a method is attempted to perform high vacuum laser ablation with a SrO target at a high vacuum of $10^{-8}$ Torr, form a strontium oxide (SrO) film as an intermediate layer temporarily, and then form a strontium titanate (Sr-$TiO_3$) film. Even in this case, if the intermediate SrO layer is thin, Ti diffuses into the SrO layer, as if a structure is obtained by directly and epitaxially growing the strontium titanate film on the silicon single crystal substrate.

In addition, it is attempted to form an intermediate layer in order to prevent reactions between the silicon single crystal substrate and an oxide having the perovskite structure, and prevent formation of the $SiO_x$ phase. So far, the following materials were reported to be used as the intermediate layer, specifically, yttria partially stabilized zirconia (YSZ) (J. Appl. Phys. Vol. 67, (1989) pp. 2447), magnesia-spinel ($MgAl_2O_4$: ISSCC Digest of Tech. Papers (1981) pp. 210), and so on. When using the intermediate layer formed from these materials, the finally obtained film has a double-layer structure produced by stacking the intermediate layer and the perovskite film in order.

An yttria partially stabilized zirconia (YSZ) thin film epitaxially grown on the silicon single crystal substrate can be obtained by pulsed-laser deposition with an YSZ ceramic target. When growing the perovskite film on the yttria partially stabilized zirconia (YSZ) thin film formed on the silicon single crystal substrate, as reported in Appl. Phys. Lett. Vol. 67 (1995) pp. 1387), epitaxy occurs involving alignment of the (011) plane of the perovskite film relative to the (001) plane of the YSZ. However, because the direction of the spontaneous polarization is along the (001) direction in a perovskite film belonging to a tetragonal phase, if the (011) plane of the perovskite film is aligned, the direction of the spontaneous polarization is inclined by 45° relative to the substrate surface. In this case, the apparent polarization in the direction perpendicular to the substrate surface decreases, and this has an unfavorable effect on applications of FeRAM or piezoelectric actuators.

In the related art, it is a well known technique to epitaxially grow thin films of oxides of rare earth elements, such as, cerium dioxide ($CeO_2$) or yttrium oxide ($Y_2O_3$) on the silicon single crystal substrate by pulsed-laser deposition using targets formed from materials having the corresponding compositions. However, since the thus obtained thin films of oxides of rare earth elements are aligned in the (011) plane relative to the silicon single crystal substrate, it is difficult to epitaxially grow the perovskite film aligned in the (100) plane.

For example, Japanese Laid Open Patent Application No. 10-120494 discloses background art of the present invention.

DISCLOSURE OF THE INVENTION

A general object of the present invention is to solve the above problems by providing a novel and useful method of fabricating a device having an epitaxial ferroelectric film.

An aspect of the present invention is to provide a method of epitaxially growing a perovskite single crystal film having a (001) orientation on a silicon single crystal substrate, and a device including the epitaxial perovskite film having the (001) orientation on the silicon single crystal substrate.

Another aspect of the present invention is to provide a capacitance device comprising a substrate having a (111) orientation; an epitaxial film formed on the substrate having a perovskite structure and a (001) orientation; and an electrode formed on the epitaxial film.

Another aspect of the present invention is to provide a ferroelectric random access memory device comprising a substrate having a (111) orientation; a gate electrode formed on the substrate; a ferroelectric epitaxial film having a perovskite structure formed between the substrate and the gate electrode, said ferroelectric epitaxial film having a (001) orientation; and a pair of diffusion regions formed on two sides of the gate electrode in the substrate.

Another aspect of the present invention is to provide an elastic surface-wave device, comprising a substrate having a (111) orientation; a ferroelectric epitaxial film having a perovskite structure formed on the substrate, said ferroelectric epitaxial film having a (001) orientation; and an interdigital electrode formed on the ferroelectric epitaxial film.

Another further aspect of the present invention is to provide a method of forming an epitaxial film having a perovskite structure, comprising a step of epitaxially growing, on a substrate having a (111) orientation, a metal oxide film having a rock salt structure and a (001) orientation; and a step of epitaxially growing, on the metal oxide film, a metal oxide film having a perovskite structure and a (001) orientation.

According to the present invention, by forming the metal oxide film having the rock salt structure on the substrate having the (111) orientation, it is possible to control the metal oxide film to have the (001) orientation. Hence, by forming the functional metal oxide film having the perovskite structure on the metal oxide film having the (001) orientation, it is possible to control the functional metal oxide film to have the (001) orientation which allows the properties of the functional metal oxide film to be exhibited strongly. By utilizing such a functional metal oxide film having a (001) orientation, it is possible to fabricate devices having various functions, such as a ferroelectric random access memory, a SAW filter, a piezoelectric actuator, or an electrostriction actuator.

BRIEF DESCRIPTION OF THE DRAWINGS

These and other objects, features, and advantages of the present invention will become more apparent with reference to the following drawings accompanying the detailed description of the present invention.

FIG. 1 illustrates a configuration of a laser ablation apparatus 1 used in the present invention;

BEST MODE FOR CARRYING OUT THE INVENTION

First Embodiment

Figure 2A:
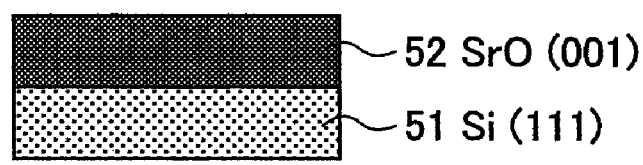
FIG. 2A through FIG. 2C show a process of forming an epitaxial $SrRuO_3$ film having a (001) orientation on a silicon substrate having a (111) orientation according to a first embodiment of the present invention.

FIG. 1 illustrates a configuration of a laser ablation apparatus 1 used in the present invention.

As illustrated in FIG. 1, the laser ablation apparatus 1 includes a processing vessel 10 exhausted by a pump 16. In the processing vessel 10, a single crystal silicon substrate 13, as a substrate to be processed, is held on a heater 12A provided a rotational axis 13A.

In addition, in the processing vessel 10, a target 15 is provided to face the substrate 13, and a high power laser beam 11 is condensed on the target 15 through a window 10A. As the laser beam 11, for example, use may be made of a KrF or ArF excimer laser, a femtosecond laser, Nd:YAG harmonic laser, or the like.

Being irradiated by the laser beam 11, the surface of the target 15 is atomized instantaneously, as a result, a flame 14, called as plume, is generated. Since the substrate 13 is located in the path of the plume 14, oxides, which are atomized on the surface of the target 15, and transported by the plume 14, are deposited on the substrate 13.

Preferably, the target 15 is a ceramic of carbonates or oxides, and rotates while being irradiated by the laser beam 11, so that the surface is uniformly exposed by the laser beam 11. Although it is illustrated that the target 15 is held on a rotating arm 17A attached to a rotational axis 17, by rotating the axis 17, it is possible to move a next target 15A to the irradiation position of the laser beam 11.

In the laser ablation apparatus 1 illustrated in FIG. 1, a heater 12B is provided to enclose a space 12C between the target 15 and the substrate 13, and by the heater 12B, the temperature in the space 12C is controlled to be approximately 800° C. Hence, by controlling the temperature in the space 12C, the target 15 is heated, and an oxide of an alkali-earth metal is formed on the surface of the target 15. The thus formed oxide, which is more stable than the carbonate, is transported in the plume 14 to the substrate 13 and is deposited there. In addition, by the heater 12B, the plume itself is heated, thereby, increasing chemical stability of oxide clusters moved in the plume 14.

Thus, the oxides arriving at the substrate 13 can hardly react with silicon constituting the substrate 13. In addition, an oxygen partial pressure of about $10^{-1}$ Torr is sufficient for forming these oxides. In contrast, when forming an oxide by CVD of the related art, an oxygen partial pressure of a few Torr is needed for decomposing organic metal raw materials. For this reason, in the apparatus 1 illustrated in FIG. 1, it is possible to effective prevent formation of an amorphous $SiO_x$ layer on the surface of the substrate 13, and enabling essentially direct epitaxial growth of a thin film of an oxide of alkali-earth metals of good quality on the single crystal silicon substrate.

In the apparatus 1 illustrated in FIG. 1, next, the target 15 can be replaced by the target 15A, which is formed from an oxide ceramic having a perovskite structure, and an oxide film having a perovskite structure can be on the alkali-earth metal oxide epitaxial thin film, which has been already formed on the substrate 13. In this process, since the surface of the substrate 13 is covered by the epitaxial film having a rock salt structure, which facilitates epitaxial growth of a perovskite oxide on the surface of the substrate 13, the perovskite oxide can be epitaxially grown easily.

The schematic view in FIG. 1 only shows the method of heating the targets 15 and 15A during the film formation process, but the present invention is not limited to this. For example, as described above, the target may be heated in an electric furnace or other kinds of processing vessels, and after production of oxides in a portion of the surface of the carbonate target, the oxides may be conveyed to the processing vessel 10 to form the film. In addition, although it is most effective to heat both the target 15 and the plume 14 as illustrated in FIG. 1, a significant effect for improving crystalline properties of the thin film can also be obtained by heating either the target 15 or the plume 14.

As basic researches of the present invention, inventors of the present invention made experiments by using the laser ablation apparatus 1 shown in FIG. 1, in which a first metal oxide film having a rock salt structure was epitaxially grown on the surface of the single crystal silicon substrate 13, in addition, a second metal oxide film having a perovskite structure was epitaxially grown on the first metal oxide film. It was found that when a substrate having a (111) orientation was used as the single crystal silicon substrate 13, as a result of the epitaxial growth, the first metal oxide film was obtained to have a (001) orientation, and by epitaxially growing a metal oxide film having the perovskite structure on the epitaxial film having the (001) orientation, the second metal oxide film was obtained to have a (001) orientation.

Figure 2B:
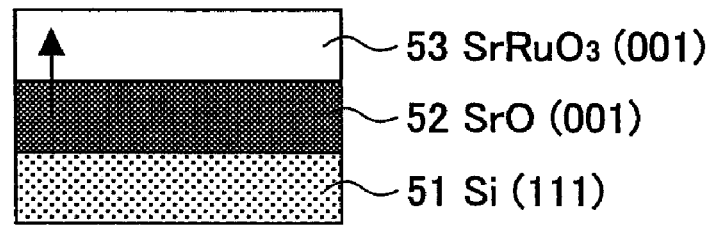
Figure 2C:
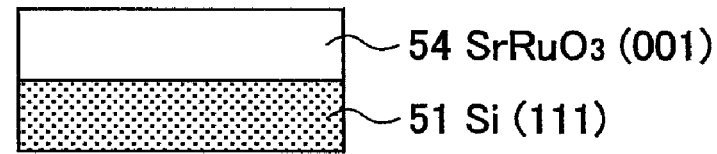

FIG. 2A through FIG. 2C show experiments performed by the inventors of the present invention as the first embodiment of the present invention.

Referring to FIG. 2A, after cleaning of a single crystal silicon substrate which has a diameter of two inches and has a (111) orientation, a surface natural oxide film is removed by processing using 9% dilute hydrofluoric acid. Further, the thus processed single crystal silicon substrate 51 is introduced into the laser ablation apparatus 1 shown in FIG. 1 to act as the substrate 13, and a SrO film 52 having a rock salt structure was deposited on the single crystal silicon substrate 51 to a thickness of 5 to 6 nm by pulsed-laser deposition using a $SrCO_3$ target as the target 15 in FIG. 1.

Further, in the step shown in FIG. 2B, a $SrRuO_3$ film 53 was deposited on the SrO film 52 having a rock salt structure to a thickness of 100 nm by pulsed-laser deposition using a $SrRuO_3$ target as the target 15.

In the steps in FIG. 2A and FIG. 2B, the temperature of the substrate is set to be 800° C. by driving the heater 12A. In the step in FIG. 2A, laser ablation of the $SrCO_3$ target is performed at a pressure of $5\times10^{-6}$ Torr for 0.5 minutes, and then at a pressure of $5\times10^{-4}$ Torr for one minute with oxygen gas being supplied at a flow rate of 12 SCCM. While, in the step in FIG. 2B, the laser ablation is performed at a pressure of 100 mTorr for 10 minutes with oxygen gas being supplied at a flow rate of 12 SCCM.

Due to the above method, as indicated by an arrow in FIG. 2B, Sr diffuses from the SrO film 52 to the SrRuO$_3$ film 53 deposited thereon, as a result, the SrO film 52 substantially disappears, and finally, as illustrated in FIG. 2C, on the single crystal silicon substrate 51, an apparently uniform SrRuO$_3$ epitaxial film 54 is obtained to maintain an epitaxial relation relative to the silicon substrate 51.

In this way, it is found that the epitaxial SrO film 52, which is formed in the step shown in FIG. 2A on the surface of the silicon substrate of the (111) orientation, has the (001) orientation, and due to this, the epitaxial SrRuO$_3$ film 53, which is formed in the step shown in FIG. 2B on the epitaxial SrO film 52, also has the (001) orientation.

Figure 3:
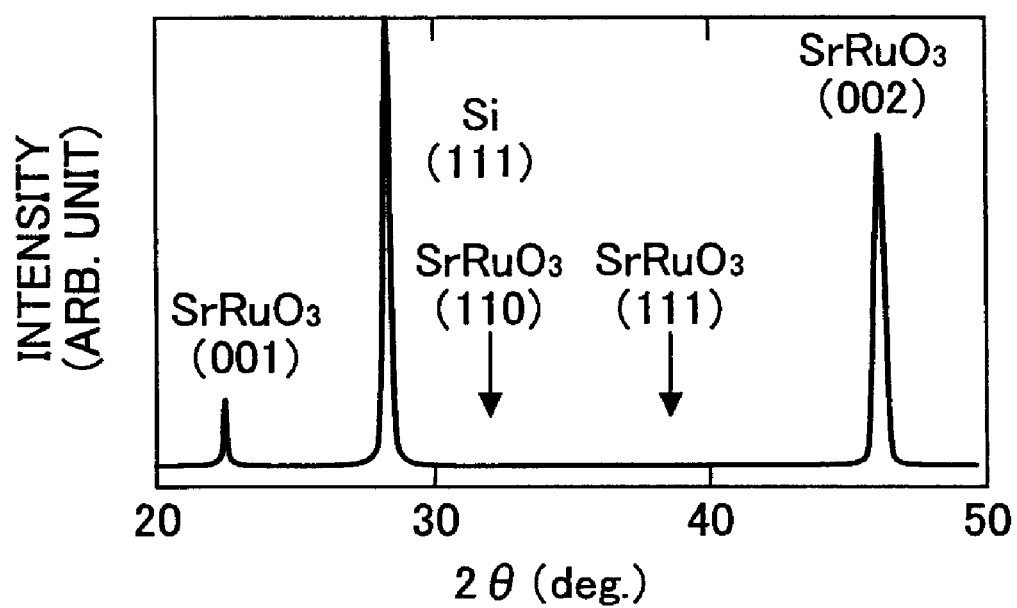
FIG. 3 shows an X-ray diffraction pattern of the $SrRuO_3$ epitaxial film obtained in the first embodiment of the present invention.

FIG. 3 shows an X-ray diffraction pattern of the thus formed SrRuO$_3$ film 54.

Referring to FIG. 3, it is found that in addition to a diffraction peak related to a silicon (111) plane of the silicon substrate 51 having the (111) orientation, clear diffraction peaks are observable which are related to a SrRuO$_3$ (001) plane and a SrRuO$_3$ (002) plane of the SrRuO$_3$ film 54 having the (001) orientation. In contrast, it is confirmed that there is not any diffraction peak at positions of SrRuO$_3$ (110) or (111) diffraction peaks presumably appearing at positions indicated by arrows in FIG. 3, namely, the obtained SrRuO$_3$ film 54 is of the (001) orientation.

Figure 4A:
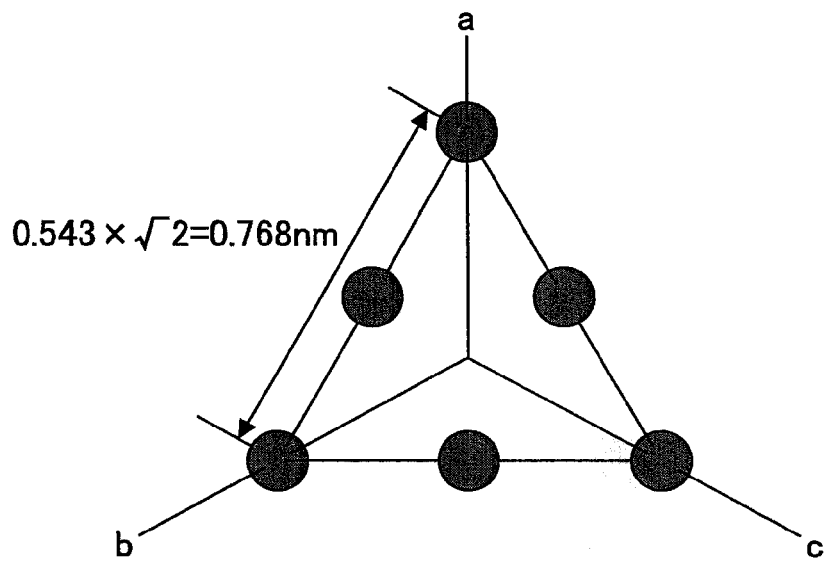
FIG. 4A illustrates an arrangement of silicon atoms in the (111) plane of silicon.
Figure 4B:
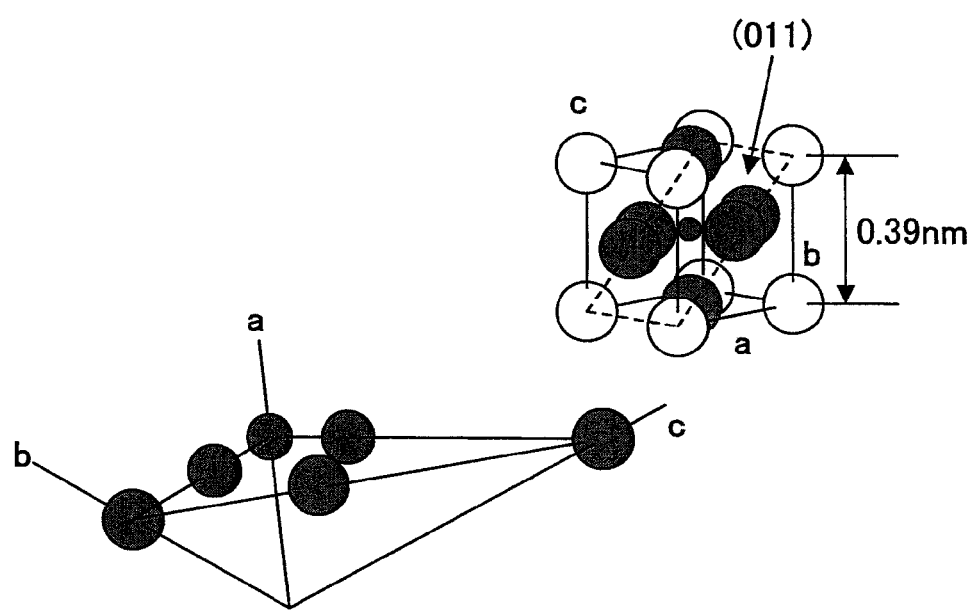
FIG. 4B illustrates epitaxial growth of a crystal film having a perovskite structure on the (111) plane of silicon.

FIG. 4A illustrates an arrangement of silicon atoms in the (111) plane of silicon, and FIG. 4B illustrates epitaxial growth of a SrRuO$_3$ crystal on the (111) plane of silicon shown in FIG. 4A.

Referring to FIG. 4A, it is observed that silicon atoms are arranged in a triangular shape with each side thereof being 0.768 nm (=2×0.383 nm), in correspondence with a trigonal axis extending along the (111) direction of a silicon crystal shown in FIG. 4A. The SrRuO$_3$ film 54 having the perovskite structure and the SrO film 52 having the rock salt structure below the SrRuO$_3$ film 54 are grown epitaxially while being in agreement with the (001) plane on the (111) plane of the silicon crystal. A lattice constant of the SrRuO$_3$ film is 0.390 nm. It should be noted that this lattice constant approximately equals a half of the side length of the triangular arrangement of silicon atoms. Further, each side of the triangle in FIG. 4A extends along the (011) direction of the silicon crystal.

Figure 4C:
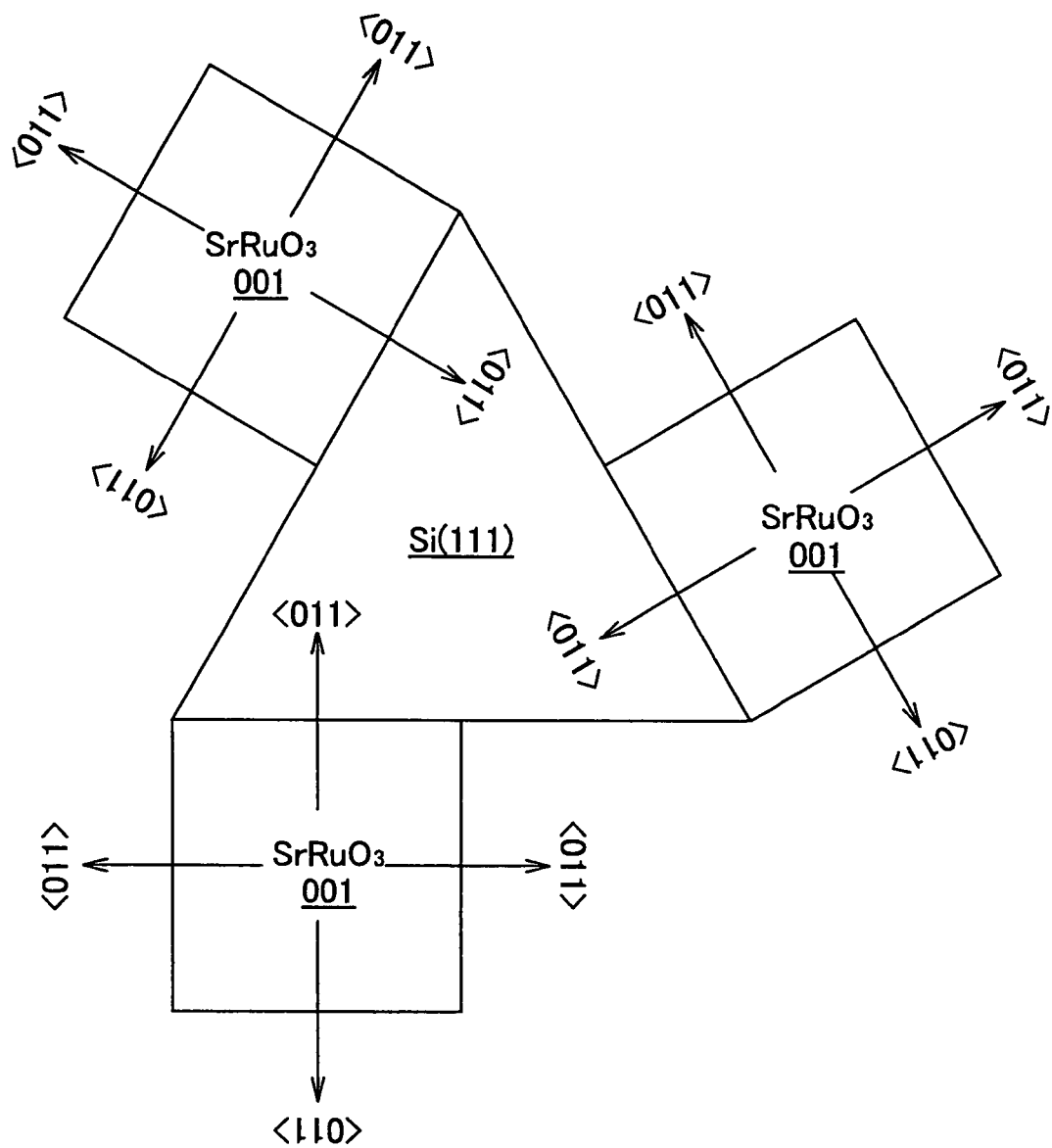
FIG. 4C illustrates another example of epitaxial growth of a crystal film having a perovskite structure on the (111) plane of silicon.

Hence, as illustrated in FIG. 4C, the SrRuO$_3$ film 54 can be epitaxially grown on the (111) plane of the silicon crystal with the lattice thereof being matched with one of the three sides defining the (111) plane of the silicon crystal. The thus obtained SrRuO$_3$ epitaxial film 54 formed in correspondence to the three sides having different orientations, respectively, includes plural domains therein having different orientations.

In FIG. 4B, the (011) plane of the SrRuO$_3$ crystal is indicated by dashed lines.

Because the SrRuO$_3$ crystal has a pseudo-cubic axis in the direction of the c-axis, namely, the (001) direction, the (011) plane shown in FIG. 4 exists in four equivalent directions, as illustrated by arrows in FIG. 4C. Therefore, taking into consideration the (111) plane of silicon equivalently existing in three directions, in the SrRuO$_3$ epitaxial film 54, the c-axis is always aligned to be in the (001) direction, but the direction of the a-axis and the direction of the b-axis are different from each other, and hence there are totally 12 domains having different orientations. These domains constitute a twin crystal in the SrRuO$_3$ epitaxial film 54.

FIG. 3 shows an X-ray diffraction pattern related to the (111) plane of the silicon crystal in the silicon substrate 51, which is measured with the silicon substrate 51 being rotated inside the plane of the substrate, that is, around an axis (φ axis) perpendicular to the substrate 51, and an X-ray diffraction pattern related to the (011) plane of the SrRuO$_3$ crystal in the SrRuO$_3$ film 54 formed on the silicon substrate 51, which is measured with the silicon substrate 51 being rotated inside the plane of the substrate.

Figure 5:
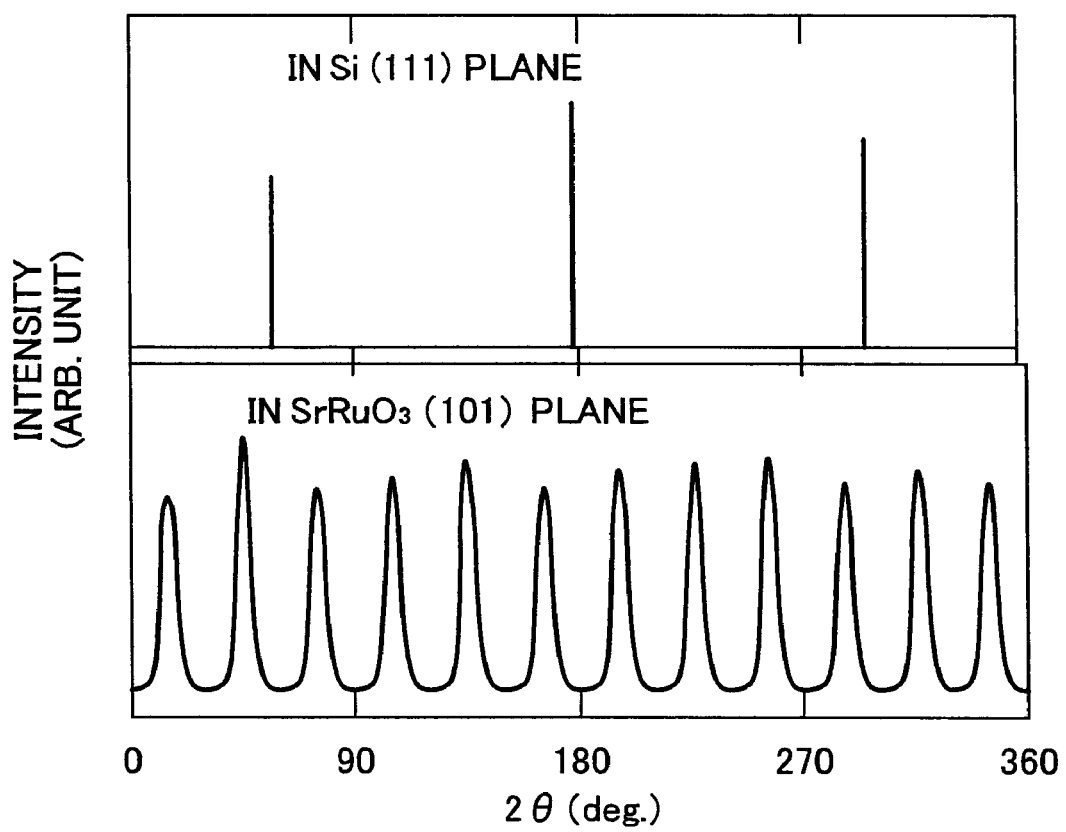
FIG. 5 shows another example of an X-ray diffraction pattern of the $SrRuO_3$ epitaxial film obtained in the first embodiment of the present invention.

Referring to FIG. 5, it is found that three diffraction peaks related to the trigonality are observed at intervals of 120° in the (111) plane of silicon. In addition, totally 12 diffraction peaks related to the (011) plane of SrRuO$_3$ are observed at intervals of 30° in the plane of the SrRuO$_3$ film 54.

As described above, in the basic researches of the present invention by the inventors of the present invention, it is found that by using the (111) plane of silicon, a SrRuO$_3$ or other perovskite films having a (001) orientation can be epitaxially grown on the (111) plane of silicon.

Figure 6:
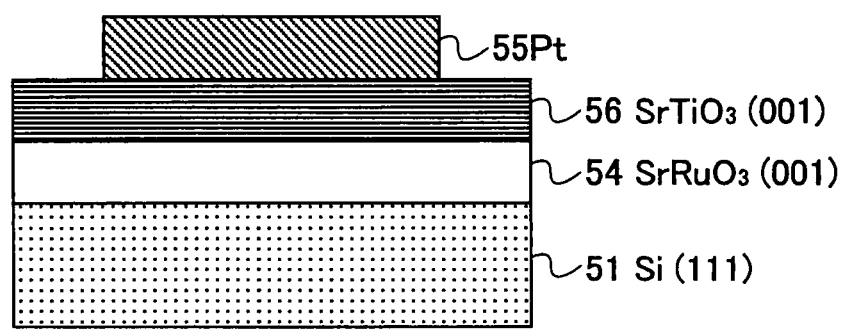
FIG. 6 shows a capacitance device according to the first embodiment of the present invention.

In the structure in FIG. 2C, by forming a dielectric film 56 having the same perovskite structure from such as SrRuO$_3$ and an electrode 55 from such as Pt on the SrRuO$_3$ film 54, a capacitance device 50 shown in FIG. 6 is obtainable.

When the dielectric film 56 is formed from SrRuO$_3$, in the laser ablation apparatus 1 shown in FIG. 1, the target 15 is changed to a SrTiO$_3$ target, and the laser beam 11 is irradiated at a pressure of 10 mTorr for 10 minutes with oxygen gas being supplied at a flow rate of 6 SCCM. As a result, the desired SrTiO$_3$ film 56 is obtained by epitaxial growth to have the (001) orientation.

The Pt electrode 55 can be formed, for example, by taking the substrate 51 out of the laser ablation apparatus 1 after cooling, and carrying out sputtering in a sputtering apparatus for 15 minutes at power of 80 W at a pressure of 7.5×1$^{-3}$ Torr with argon gas being supplied at a flow rate of 30 SCCM.

After the Pt electrode 55 is formed, the substrate 51 is heated at a temperature of 600° C. for one hour with oxygen gas being supplied at a flow rate of 5 liter per minute so as to recover damages in the SrTiO$_3$ film 56 induced in the course of sputtering of the Pt electrode 55.

As described above, in the capacitance device 50 shown in FIG. 6, the SrRuO$_3$ film 54 is a single phase film with the SrO film 52 formed at the beginning, shown in FIG. 2A, being incorporated into by the mechanisms illustrated in FIG. 2B.

Figure 7:
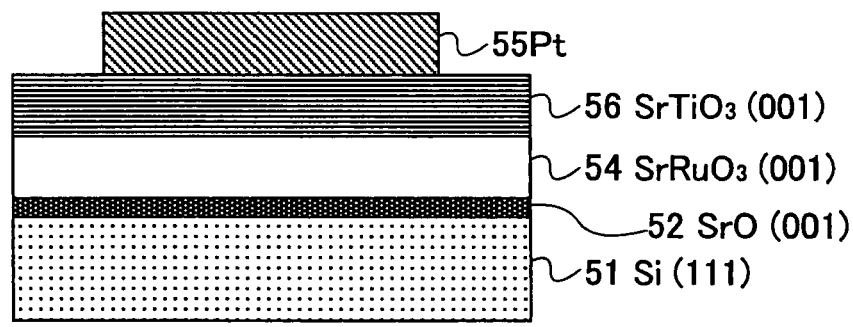
FIG. 7 shows a modification to the capacitance device in FIG. 6.

In the step in FIG. 2A, by a thick SrO film 52 beforehand, as shown in FIG. 7, the SrO film 52 remains between the silicon substrate 51 and the SrRuO$_3$ film 54 even after the step in FIG. 2C as illustrated in FIG. 7.

FIG. 7 shows a capacitance device 50A as a modification to the capacitance device 50 in FIG. 6.

Second Embodiment

FIG. 8A through FIG. 8D illustrate a process of forming an epitaxial SrRuO$_3$ film on the silicon (111) plane according to a second embodiment of the present invention. In FIG. 8A through FIG. 8D, the same reference numbers are used for the same elements as described previously, and overlapping descriptions are omitted.

Figure 8A:
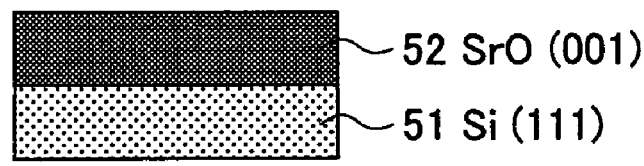
FIG. 8A through FIG. 8D illustrate a process of forming an epitaxial $SrRuO_3$ film on a silicon (111) plane according to a second embodiment of the present invention.
Figure 8B:
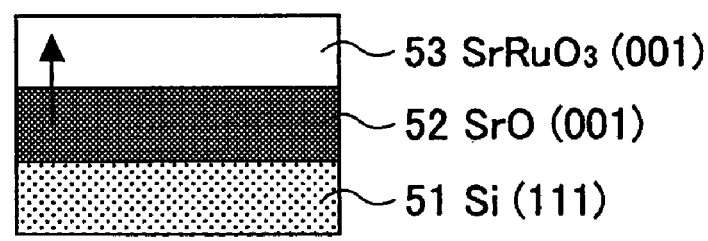
Figure 8C:
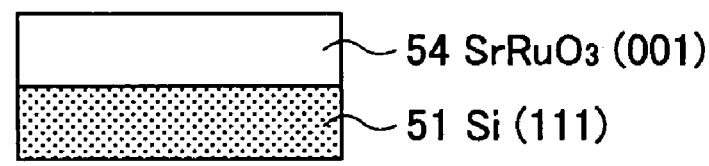

Referring to FIG. 8A through FIG. 8D, the steps in FIG. 8A through FIG. 8C are the same as those in FIG. 2A through FIG. 2C, that is, an epitaxial SrRuO$_3$ film 54 is formed in the step in FIG. 8C, corresponding to the step in FIG. 2C, on the silicon substrate 51 having a (111) orientation.

Figure 8D:
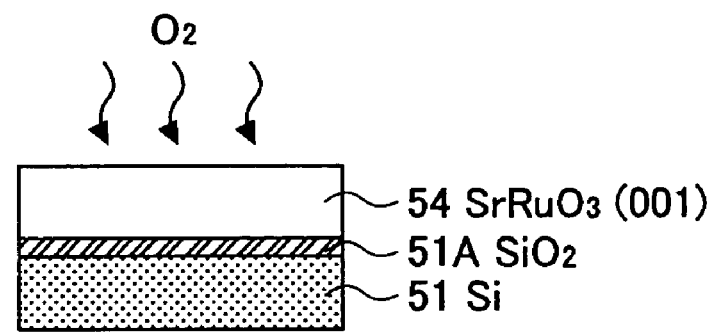

Furthermore, in the present embodiment, in the step in FIG. 8D, the structure in FIG. 8C is heated at a temperature of 1050° C. for two hours with vapor and oxygen carrier gas being supplied at a flow rate of 5 SLM, to form a thermal oxide film 51A in an interface of the SrRuO₃ film 54 and the silicon substrate 51, for example until the total thickness of the SrRuO₃ film 54 and the thermal oxide film 51A becomes 150 nm.

In the present embodiment, because the thermal oxide film 51A is formed after the SrRuO₃ film 54 is formed, epitaxy persists between the silicon substrate 51 and the SrRuO₃ film 54 even when the thermal oxide film 51A having an amorphous phase exists between he silicon substrate 51 and the SrRuO₃ film 54.

Third Embodiment

Figure 9:
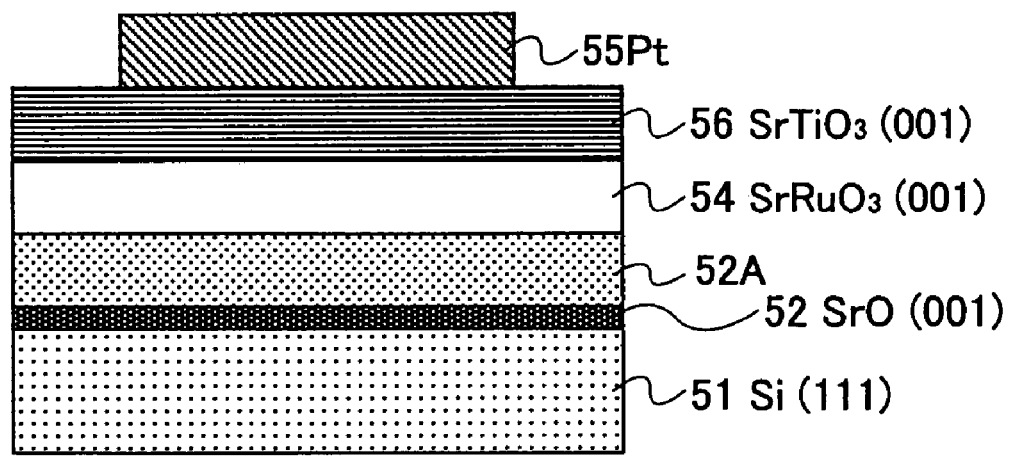
FIG. 9 illustrates a configuration of a capacitance device according to a third embodiment of the present invention.

FIG. 9 illustrates a configuration of a capacitance device 60 according to a third embodiment of the present invention. In FIG. 9, the same reference numbers are used for the same elements as described previously, and overlapping descriptions are omitted.

Referring to FIG. 9, in the present embodiment, An intermediate film 52A of good insulting property is interposed between the SrO film 52 and the SrRuO₃ epitaxial film 54.

Figure 10:
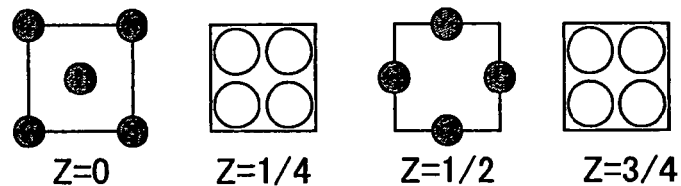
FIG. 10 shows a crystal structure of an intermediate film having a fluorite structure and used in the capacitance device in FIG. 9.
Figure 11:
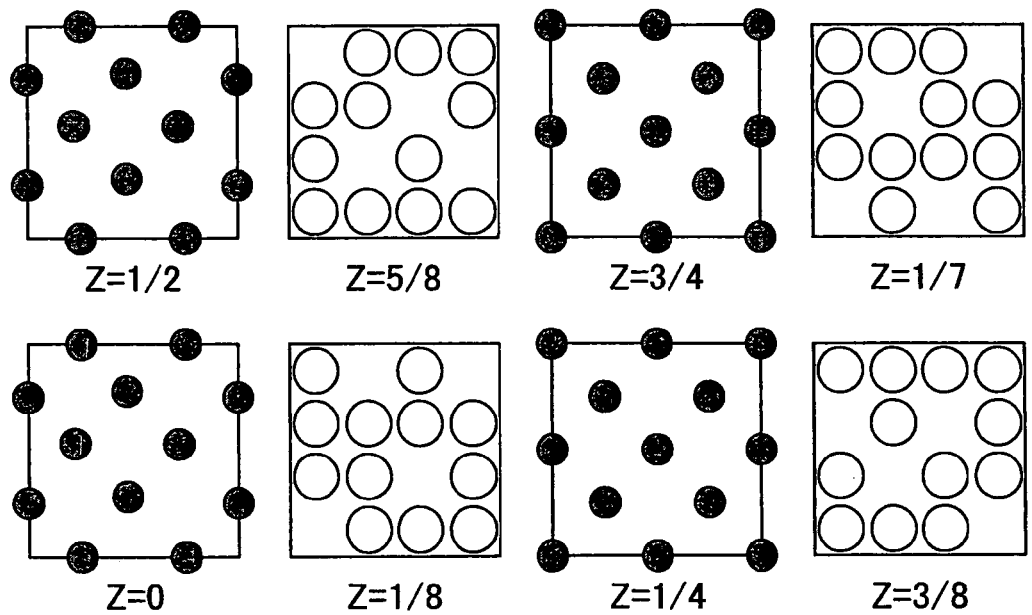
FIG. 11 shows a crystal structure of an intermediate film having a C-rare-earth structure and used in the capacitance device in FIG. 9.
Figure 12:
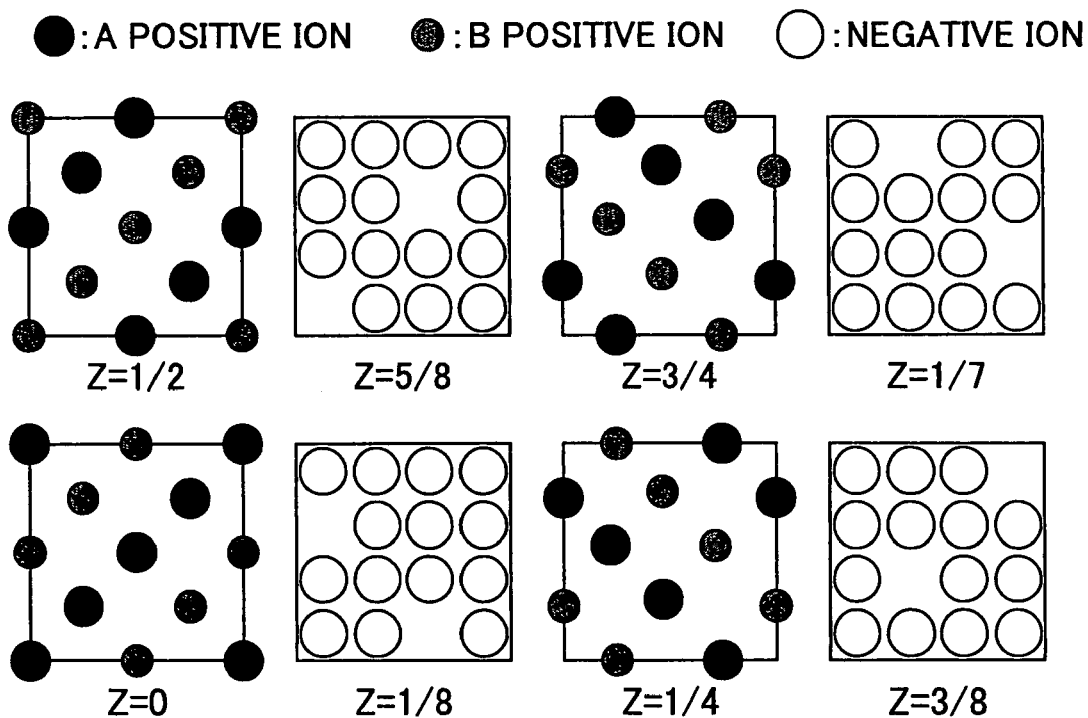
FIG. 12 shows a crystal structure of an intermediate film having a pyrochlore structure and used in the capacitance device in FIG. 9.

The intermediate film 52A may be formed from compounds having a fluorite (CaF) structure as illustrated in FIG. 10, such as $ZrO_2$, $HfO_2$, $CeO_2$, or $PrO_2$, or oxides represented by the formula $R_2O_3$ and having a C-rare-earth structure as illustrated in FIG. 11 (R represents Sc, Ce, Y, Pr, Nd, Eu, Tb, Dy, Ho, Yb, Y, Sm, Gd, Er, or La), or oxides represented by the formula $R_2O_3$ and having an A-rare-earth structure (R represents La, Ce, Pr, Nd, or Gd), or compounds having a pyrochlore structure as illustrated in FIG. 12 and represented by the formula $R_3B'O_7$ (where, R represents a trivalent rare-earth element, and B' represents a pentavalent transition-metal element).

Figure 13:
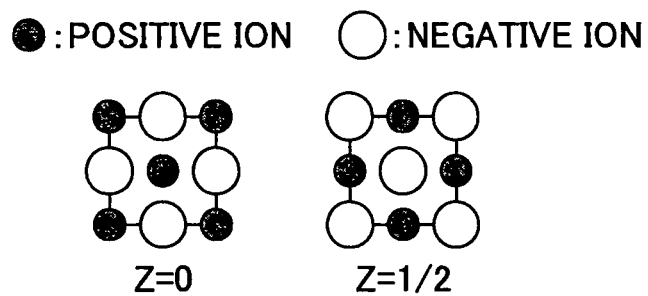
FIG. 13 shows a rock salt structure.

FIG. 13 shows a well-known rock salt structure.

Note that FIG. 10 through FIG. 13 are cross-sectional views illustrating atomic arrangements of positive ions and negative ions in a crystal in cross sectional planes cut at different heights Z along the direction of the c-axis, where Z represents a normalized height in a unit cell.

In the embodiment shown in FIG. 9, the intermediate film 52A may also be a film having the same perovskite crystal structure as the SrRuO₃ film 54, but different compositions from the SrRuO₃ film 54. Further, the perovskite films 53 and 54 may be formed from a material having a main composition expressed by one of $SrRuO_3$, $CaRuO_3$, $LaNiO_3$, $(La_xSr_{1-x})CoO_3$ ($0 \leq x \leq 1$), $(La_xSr_{1-x})MnO_3$ ($0 \leq x \leq 1$), and $(Ba_xSr_{1-x})TiO_3$ ($0 \leq x \leq 1$).

Particularly, according to the present invention, by using materials such as $Pb(Zr,Ti)O_3$ (the so-called PZT), $(Ba_xSr_{1-x})TiO_3$ ($0 \leq x \leq 1$), or $(Pb_{1-y}La_{3/2y})(Zr_{1-x}Ti_x)O_3$ ($0 \leq x, y \leq 1$) (the so-called PLZT), a ferroelectric epitaxial film can be formed. When forming the ferroelectric epitaxial film, by adding additives suitable to the ferroelectric perovskite film, the ferroelectric properties can be further improved. For example, in the case of a PZT film, by adding a bivalent transition-metal element B' and a pentavalent transition-metal element B", it is possible to form an epitaxial film having a composition expressed by $Pb(B'_{1/3}B''_{2/3})_xTi_yZr_{1-x-y}O_3$ ($0 \leq x, y \leq 1$). Further, by adding a trivalent transition-metal element B' and a pentavalent transition-metal element B", it is possible to form an epitaxial film having a composition expressed by $Pb(B'_{1/2}B''_{1/2})_xTi_yZr_{1-x-y}O_3$ ($0 \leq x, y \leq 1$), or by $Pb(B'_{1/3}B''_{2/3})_xTi_yZr_{1-x-y}O_3$ ($0 \leq y, x \leq 1$, where, B' represents a hexavalent transition-metal element, B" represents a trivalent transition-metal element). Further, it is possible to form an epitaxial film expressed by $(Bi_{4-x}R_x)(Ti_{3-y}W_{1/2y})O_{12}$ (where, $3 \geq x \geq 0$, $1 \geq y \geq 0$, and R represents a rare-earth element such as Y, and Sc), or expressed by $(Bi_{4-x}R_x)(Ti_{3-y}V_{4/5y})O_{12}$ (where, $3 \geq x \geq 0$, $1 \geq y \geq 0$, and R represents a rare-earth element such as Y, and Sc).

In order to facilitate growth of a perovskite film on another perovskite film, for example, the perovskite film 54 in the structure shown in FIG. 2C can be formed as a multi-layer structure.

On the other hand, the film 52 of a rock salt structure may be formed from a film having a main composition of MgO, CaO, BaO, SrO, or a mixture of them.

Figure 14:
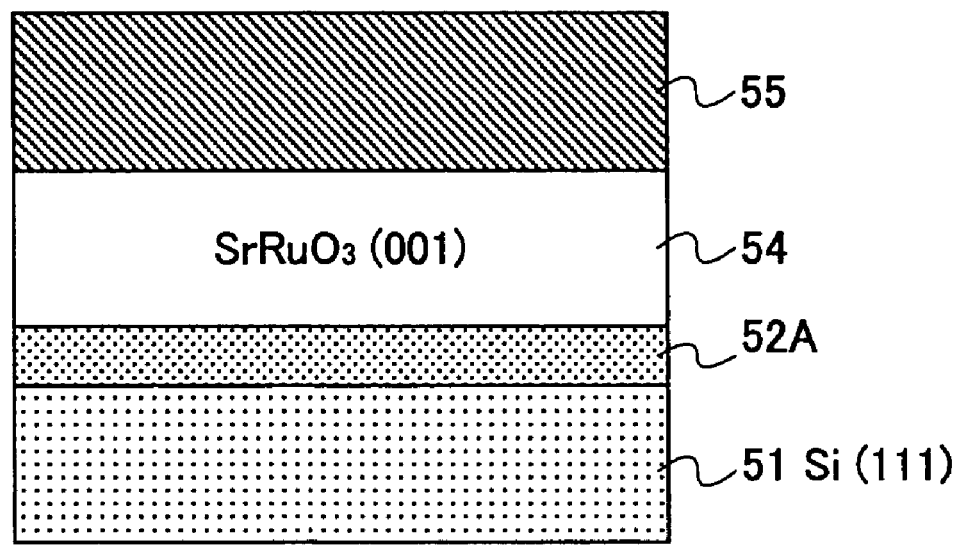
FIG. 14 shows a modification to the capacitance device in FIG. 9.

In addition, as shown in FIG. 14, if the SrO film 52 in the structure shown in FIG. 9 is formed to be thin, after the SrRuO₃ epitaxial film 54 is formed, a structure can be formed in which the intermediate film 52A apparently is in contact with the silicon substrate 51.

Note that although it is described above that a silicon substrate having a (111) orientation is used as the substrate 51, in the present embodiment, the substrate 51 is not limited to a silicon substrate.

Fourth Embodiment

Figure 15:
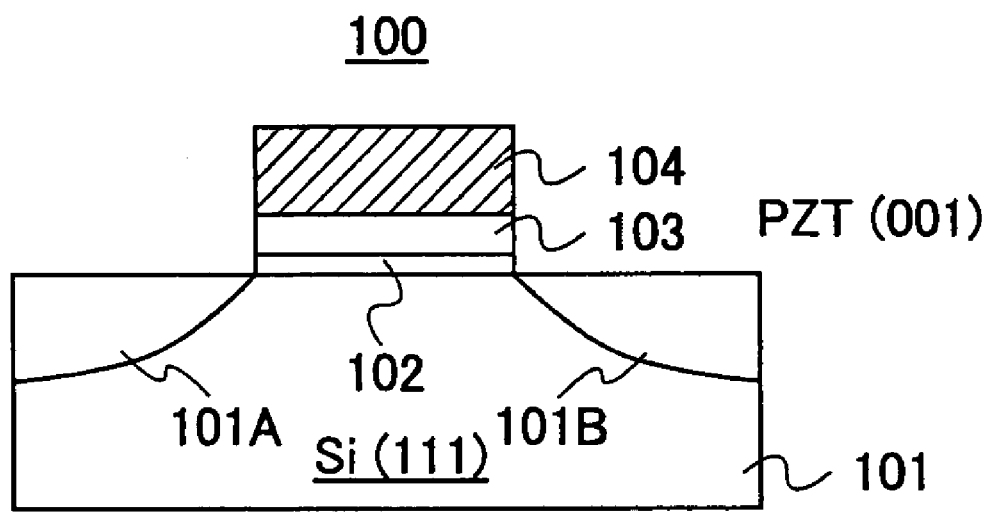
FIG. 15 illustrates a configuration of a Ferro-electric Random Access Memory (FeRAM) according to a fourth embodiment of the present invention.

FIG. 15 illustrates a configuration of a Ferroelectric Random Access Memory (FeRAM) 100 according to a fourth embodiment of the present invention.

Referring to FIG. 15, the FeRAM 100 is formed on a single crystal silicon substrate 101 having a (111) orientation, and includes a gate insulating film comprising a SrTiO₃ film 102 epitaxially formed on the single crystal silicon substrate 101, and a PZT film 103 epitaxially formed on the SrTiO₃ film 102.

The SrTiO₃ film 102 is formed following the same steps as illustrated in FIG. 2A through FIG. 2C, except that a SrTiO₃ target is used as the target 15 instead of the SrRuO₃ target, and has a (001) orientation relative to the single crystal silicon substrate 101 of a (111) orientation, that is, with its c-axis being perpendicular to the primary surface of the substrate. Hence, the PZT film 103 formed on the SrTiO₃ film 102 also has the (001) orientation.

A gate electrode 55 is formed from Pt or the like on the PZT film 103, and diffusion regions 101A and 101B formed on two sides of the gate electrode 104 in the silicon substrate 101.

In the present embodiment, the PZT film 103 can be formed, after the SrTiO₃ film 102 is formed and the target 15 is changed from SrTiO₃ to PZT, by irradiating a pulsed-laser beam 11 from a KrF excimer laser for 15 minutes at a substrate temperature of 650° C. and a pressure of 200 mTorr with oxygen gas being supplied at a flow rate of 6 SCCM.

After the gate electrode 104 is formed by sputtering, the thus formed PZT film 103 is heated at a substrate temperature of 600° C. for one hour with oxygen gas being supplied at a flow rate of 5 liter per minute so as to recover damages induced in the course of sputtering of the gate electrode 104.

In the FeRAM 100 having the above configuration, by applying a write voltage on the gate electrode 104, electric polarization is induced in the epitaxial PZT film 103, and a threshold voltage of the transistor changes.

Upon that, when reading out data, a read voltage is applied on the gate electrode 104, conductance between the diffusion regions 101A and 101B is detected, and data written in the PZT film 103 in form of residual electric polarization can be read out.

According to the present invention, the epitaxial PZT film 103 formed as described above has an orientation with its c-axis being perpendicular to the primary surface of the silicon substrate 101 of a (111) orientation, nevertheless since the electric polarization is induced along the direction of the c-axis in the PZT film 103, the residual electric polarization becomes maximum. Therefore, in such a FeRAM, the read voltage can be minimized.

In the present embodiment, following the same steps as illustrated in FIG. 8A through FIG. 8D, a thermal oxide film may be formed in an interface of the $SrTiO_3$ epitaxial film 102 and the silicon substrate 101 after growing the $SrTiO_3$ epitaxial film so as to reduce a gate leakage current.

In the present embodiment, configurations illustrated in FIG. 6, FIG. 7, FIG. 9, or FIG. 14 may be employed.

In the FeRAM 100 of the present embodiment, the $SrTiO_3$ epitaxial film 102 may also be omitted, and the PZT film 103 may be formed following the steps in FIG. 2A through FIG. 2C or in FIG. 8A through FIG. 8D.

Further, in the present embodiment, instead of the PZT film 103, a film may be used which has a composition selected from one of $Pb(Zr_{1-x}T_x)O_3$ ($0 \leq x \leq 1$), $(Pb_{1-y}La_{3/2y})(Zr_{1-x}Ti_x)O_3$ ($0 \leq x, y \leq 1$), $Pb(B'_{1/3}B''_{2/3})_xTi_yZr_{1-x-y}O_3$ ($0 \leq x, y \leq 1$, where, B' represents a bivalent transition-metal element, B'' represents a pentavalent transition-metal element), $Pb(B'_{1/2}B''_{1/2})_xTi_yZr_{1-x-y}O_3$ ($0 \leq x, y \leq 1$, where, B' represents a trivalent transition-metal element, B'' represents a pentavalent transition-metal element), $(Sr_{1-x}Ba_x)Nb_2O_6$ ($0 \leq x \leq 1$), $(Sr_{1-x}Ba_x)Ta_2O_6$ ($0 \leq x \leq 1$), $PbNb_2O_6$ ($0 \leq x \leq 1$), $Ba_2NaNb_5O_{15}$, $(Ba_xSr_{1-x})TiO_3$ ($0 \leq x \leq 1$).

Fifth Embodiment

Figure 16A:
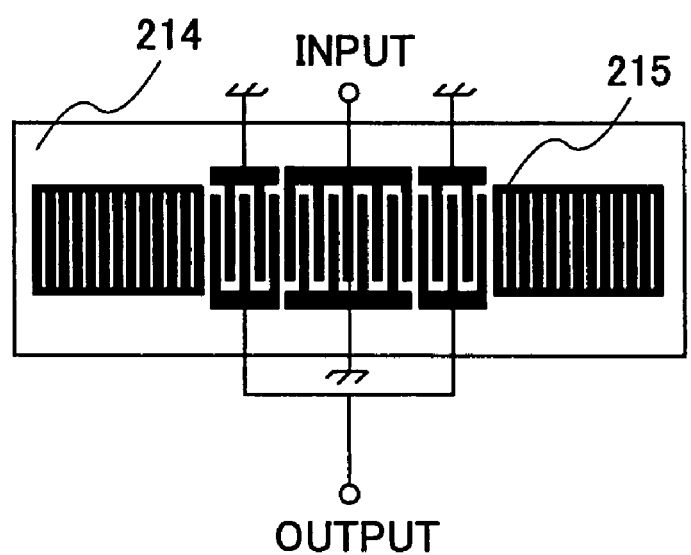
FIG. 16A and FIG. 16B illustrate a configuration of a SAW filter according to a fifth embodiment of the present invention.
Figure 16B:
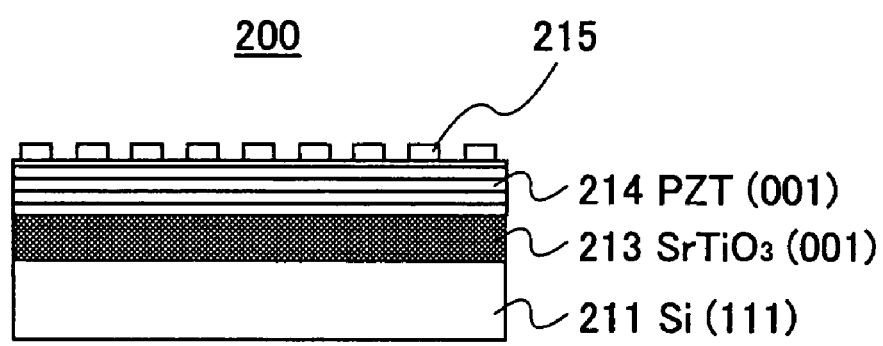

FIG. 16A and FIG. 16B illustrate a configuration of a SAW filter 200 according to a fifth embodiment of the present invention.

Referring to FIG. 16A and FIG. 16B, the SAW filter 200 is formed on a single crystal silicon substrate 211 having a (111) orientation, and includes a $SrTiO_3$ epitaxial film 213 having a (001) orientation and formed on the single crystal silicon substrate 211 following the steps in FIG. 2A through FIG. 2C, and a PZT epitaxial film 213 having a (001) orientation and formed on the $SrTiO_3$ epitaxial film 213.

Further, an interdigital electrode 215 is formed on the PZT epitaxial film 214.

In such a SAW filter 200, because the ferroelectric PZT film 214 is a (001) alignment film, it can effectively excite elastic surface wave, and minimize loss.

In addition, a stacked structure including a ferroelectric epitaxial film such as the PZT film having a (001) orientation may be applied to a piezoelectric actuator, or an electrostriction actuator.

In the present embodiment, instead of the PZT film 214, a film may also be used which has a composition selected from one of $Pb(Zr_{1-x}Ti_x)O_3$ ($0 \leq x \leq 1$), $(Pb_{1-y}La_{3/2y})(Zr_{1-x}Ti_x)O_3$ ($0 \leq x, y \leq 1$), $Pb(B'_{1/3}B'_{2/3})_xTi_yZr_{1-x-y}O_3$ ($0 \leq x, y \leq 1$, where, B' represents a bivalent transition-metal element, B'' represents a pentavalent transition-metal element), $Pb(B'_{1/2}B''_{1/2})_xTi_yZr_{1-x-y}O_3$ ($0 \leq x, y \leq 1$, where, B' represents a trivalent transition-metal element, B'' represents a pentavalent transition-metal element), $Pb(B'_{1/3}B'_{2/3})_xTi_yZr_{1-x-y}O_3$ ($0 \leq y, x \leq 1$, where, B' represents a hexavalent transition-metal element, B'' represents a trivalent transition-metal element), $(Sr_{1-x}Ba_x)Nb_2O_6$ ($0 \leq x \leq 1$), $(Sr_{1-x}Ba_x)Ta_2O_6$ ($0 \leq x \leq 1$), $PbNb_2O_6$ ($0 \leq x \leq 1$), $Ba_2NaNb_5O_{15}$, $(Ba_xSr_{1-x})TiO_3$ ($0 \leq x \leq 1$), $(Bi_{4-x}R_x)(Ti_{3-y}W_{1/2y})O_{12}$ (where, $3 \leq x \leq 0$, $1 \geq y \geq 0$, and R represents a rare-earth element such as Y, and Sc), $(Bi_{4-x}R_x)(Ti_{3-y}V_{4/5y})O_{12}$ (where, $3 \geq x \geq 0$, $1 \geq y \geq 0$, and R represents a rare-earth element such as Y, and Sc).

Sixth Embodiment

Below, as a sixth embodiments of the present invention, descriptions are made of an actuator utilizing a piezoelectric effect and an electrostriction effect, which is an important application of the present invention.

After cleaning of a single crystal silicon substrate which has a diameter of two inches and has a (111) orientation, the silicon substrate is immersed into a 9% dilute hydrofluoric acid solution to remove a surface natural oxide film on the surface of the substrate.

Figure 17A:
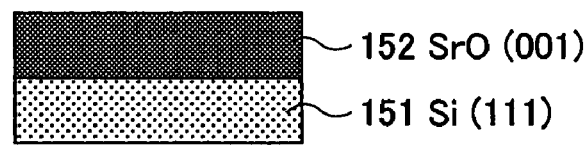
FIG. 17A through FIG. 17E illustrate a process of forming a piezoelectric actuator according to a sixth embodiment of the present invention.

Next, the thus processed single crystal silicon substrate is introduced into the laser ablation apparatus 1 shown in FIG. 1 to act as the substrate 13, and is maintained to be at a temperature of 800° C. The pressure inside the processing vessel 10 is lowered to be $5 \times 10^{-6}$ Torr, and then, a pulsed-laser beam 11 from a Nd:YAG laser is irradiated on a SrO target 15 for 1 minutes at a pressure of $5 \times 10^{-4}$ Torr with oxygen gas being supplied at a flow rate of 12 SCCM to execute the step in FIG. 17A, which corresponds to the step in FIG. 2A described previously. In this way, a SrO film 152 having the (001) orientation is epitaxially grown on the silicon substrate 151 having the (111) orientation, which corresponds to the substrate 13.

Figure 17B:
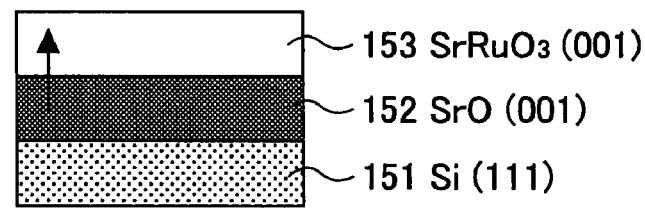

Next, in the laser ablation apparatus 1 shown in FIG. 1, the target 15 is changed to a $SrRuO_3$ target, and the laser beam 11 is irradiated to the $SrRuO_3$ target at a pressure of 100 mTorr for 10 minutes with oxygen gas being supplied at a flow rate of 6 SCCM. As a result, as illustrated in FIG. 17B, the $SrRuO_3$ film 153 is epitaxially grown on the SrO film 152 with the (001) orientation, whereas, Sr in the SrO film 152 diffuses into the $SrRuO_3$ film 153 deposited thereon, consequently, as illustrated in FIG. 17C, on the single crystal silicon substrate 151, the $SrRuO_3$ single phase film 153 is obtained with an epitaxial relation being maintained.

Figure 17C:
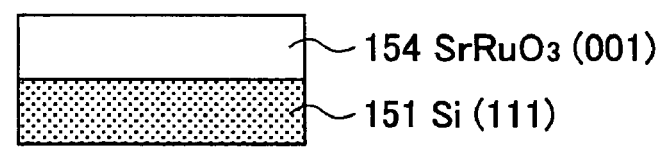
Figure 17D:
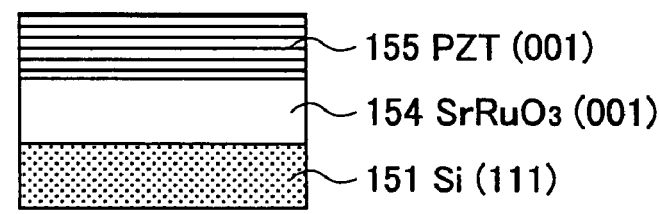

Next, in the step shown in FIG. 17D, the structure illustrated in FIG. 17C is taken out of the processing vessel 10, and is cooled. Then, 0.3 cc PLZT sol-gel solution with a composition ratio of Pb:La:Zr:Ti equaling 113:3:45:55 is dropped onto the $SrRuO_3$ film 154, and the substrate 151 is rotated, and then the solvent is vaporized on a hot plate maintained at a temperature of 350° C. Thereby, a PLZT spin-coat film 155 is formed on the $SrRuO_3$ film 154.

After the process of forming the PLZT spin-coat film 155 is repeated for three times, thermal treatment is executed at a temperature of 650° C. for 10 minutes with oxygen gas being supplied at a flow rate of 5 liter per minute so as to crystallize the PLZT spin-coat film 155. During the crystallization process, epitaxy between the PLZT spin-coat film 155 and the $SrRuO_3$ film 154 therebelow is being maintained, and the PLZT spin-coat film 155 is crystallized to have the (001) orientation.

Figure 17E:
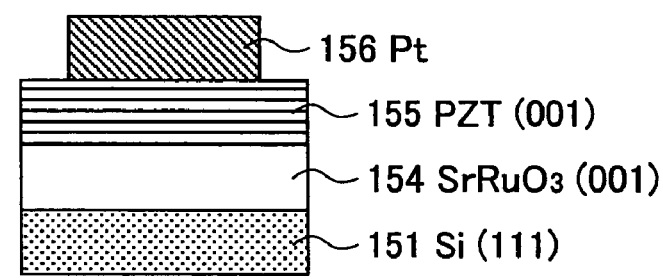

Further, in the step shown in FIG. 17E, a Pt film is formed on the PLZT film 155 by sputtering with a predetermined mask, thereby forming a Pt electrode 156.

The structure in FIG. 17E constitutes a unimorph piezoelectric actuator.

While the invention has been described with reference to preferred embodiments, the invention is not limited to these embodiments, but numerous modifications could be made thereto without departing from the basic concept and scope described in the claims.

INDUSTRY APPLICABILITY

According to the present invention, by forming a metal oxide film having a rock salt structure on a single substrate having a (111) orientation, it is possible to control the metal oxide film to have a (001) orientation. Hence, by forming the functional metal oxide film having a perovskite structure on the metal oxide film having the (001) orientation, it is possible to control the functional metal oxide film to have the (001) orientation which allows the properties of the functional metal oxide film to be exhibited strongly. By utilizing such a functional metal oxide film having the (001) orientation, it is possible to fabricate devices having various functions, such as a ferroelectric random access memory, a SAW filter, or a ferroelectric actuator.

The invention claimed is:

1. A capacitance device, comprising:
    a substrate having a (111) orientation;
    an epitaxial film formed on the substrate and having a perovskite structure and a (001) orientation; and
    an electrode formed on the epitaxial film.

2. The capacitance device as claimed in the claim 1, wherein the substrate is formed from a silicon substrate.

3. The capacitance device as claimed in the claim 1, wherein another epitaxial film having the perovskite structure and the (001) orientation is formed on said epitaxial film.

4. The capacitance device as claimed in the claim 3, wherein the another epitaxial film is a ferroelectric film.

5. The capacitance device as claimed in the claim 4, wherein the another epitaxial film has a composition selected from one of $Pb(Zr_{1-x}Ti_x)O_3$ ($0 \leq x \leq 1$), $(Pb_{1-y}La_{3/2y})(Zr_{1-x}Ti_x)O_3$ ($0 \leq x, y \leq 1$), $Pb(B'_{1/3}B''_{2/3})_xTi_yZr_{1-x-y}O_3$ ($0 \leq x, y \leq 1$, where, B' represents a bivalent transition-metal element, B" represents a pentavalent transition-metal element), $Pb(B'_{1/2}B''_{1/2})_xTi_yZr_{1-x-y}O_3$ ($0 \leq x, y \leq 1$, where, B' represents a trivalent transition-metal element, B" represents a pentavalent transition-metal element), $(Sr_{1-x}Ba_x)Nb_2O_6$ ($0 \leq x \leq 1$), $(Sr_{1-x}Ba_x)Ta_2O_6$ ($0 \leq x \leq 1$), $PbNb_2O_6$ ($0 \leq x \leq 1$), $Ba_2NaNb_5O_{15}$, $(Ba_xSr_{1-x})TiO_3$ ($0 \leq x \leq 1$).

6. The capacitance device as claimed in the claim 1, wherein an amorphous film is between the substrate and the epitaxial film.

7. The capacitance device as claimed in the claim 1, wherein another epitaxial film having a rock salt structure and the (001) orientation is formed between the substrate and the epitaxial film.

8. The capacitance device as claimed in the claim 7, wherein the another epitaxial film of a rock salt structure has a composition selected from a group consisting of MgO, CaO, BaO, SrO, and mixtures of them.

9. The capacitance device as claimed in the claim 1, wherein an intermediate film having a fluorite structure is formed between the substrate and the epitaxial film and in contact with the epitaxial film, said intermediate film being epitaxially formed on the substrate.

10. The capacitance device as claimed in the claim 9, wherein the intermediate film has a composition selected from a group consisting of $ZrO_2$, $HfO_2$, $CeO_2$, and $PrO_2$.

11. The capacitance device as claimed in the claim 1, wherein an intermediate film having a C-rare-earth structure is formed between the substrate and the epitaxial film and in contact with the epitaxial film, said intermediate film being epitaxially formed on the substrate.

12. The capacitance device as claimed in the claim 11, wherein the intermediate film is formed from one of oxides represented by a formula $R_2O_3$, where, R represents one of Sc, Ce, Y, Pr, Nd, Eu, Tb, Dy, Ho, Yb, Y, Sm, Gd, Er, and La.

13. The capacitance device as claimed in the claim 1, wherein an intermediate film having an A-rare-earth structure is formed between the substrate and the epitaxial film and in contact with the epitaxial film, said intermediate film being epitaxially formed on the substrate.

14. The capacitance device as claimed in the claim 13, wherein the intermediate film is formed from one of oxides represented by a formula $R_2O_3$, where, R represents one of La, Ce, Pr, Nd, and Gd.

15. The capacitance device as claimed in the claim 1, wherein an intermediate film having a pyrochlore structure is formed between the substrate and the epitaxial film and in contact with the epitaxial film, said intermediate film being epitaxially formed on the substrate.

16. The capacitance device as claimed in the claim 1, wherein the epitaxial film has a main composition selected from one of $SrRuO_3$, $CaRuO_3$, $LaNiO_3$, $(La_xSr_{1-x})CoO_3$ ($0 \leq x \leq 1$), $(La_xSr_{1-x})MnO_3$ ($0 \leq x \leq 1$), and $(Ba_xSr_{1-x})TiO_3$ ($0 \leq x \leq 1$).

17. A ferroelectric random access memory device, comprising:
    a single crystal semiconductor layer having a (111) orientation;
    a gate electrode formed on the single crystal semiconductor layer;
    a ferroelectric epitaxial film having a perovskite structure formed between the single crystal semiconductor layer and the gate electrode, said ferroelectric epitaxial film having a (001) orientation; and
    a pair of diffusion regions formed on two sides of the gate electrode in the single crystal semiconductor layer.

* * * * *

UNITED STATES PATENT AND TRADEMARK OFFICE
CERTIFICATE OF CORRECTION

PATENT NO. : 7,339,219 B2 Page 1 of 1
APPLICATION NO. : 11/063731
DATED : March 4, 2008
INVENTOR(S) : Masao Kondo et al.

It is certified that error appears in the above-identified patent and that said Letters Patent is hereby corrected as shown below:

On the Cover page:

In Item 63 insert --Continuation of application No. PCT/JP2003/002516, filed on March 4, 2003-- as the Related U.S Application Data.

Signed and Sealed this

First Day of June, 2010

David J. Kappos
*Director of the United States Patent and Trademark Office*